United States Patent
Lin et al.

(10) Patent No.: US 9,029,684 B2
(45) Date of Patent: May 12, 2015

(54) HYBRID SOLAR RECEIVER AND CONCENTRATING SOLAR SYSTEM COMPRISING THE SAME

(75) Inventors: Qinglong Lin, Myans (FR); André Manificat, Myans (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 65 days.

(21) Appl. No.: 13/318,828

(22) PCT Filed: May 5, 2010

(86) PCT No.: PCT/FR2010/050860
§ 371 (c)(1),
(2), (4) Date: Dec. 29, 2011

(87) PCT Pub. No.: WO2010/128251
PCT Pub. Date: Nov. 11, 2010

(65) Prior Publication Data
US 2012/0097216 A1    Apr. 26, 2012

(30) Foreign Application Priority Data

May 6, 2009   (FR) ...................... 09 53028

(51) Int. Cl.
*H01L 35/04* (2006.01)
*F24J 2/04* (2006.01)
(Continued)

(52) U.S. Cl.
CPC .............. *F28D 21/0001* (2013.01); *F24J 2/06* (2013.01); *F24J 2/07* (2013.01); *F28D 15/0233* (2013.01);
(Continued)

(58) Field of Classification Search
CPC ..... H01L 25/042; H01L 25/045; H01L 27/14; H01L 27/142; H01L 27/301; H01L 31/0203; H01L 31/0216; H01L 31/02168; H01L 31/0406; H01L 31/042; H01L 31/052

USPC .......... 136/206, 210, 244, 246, 248, 251, 252
See application file for complete search history.

(56) References Cited

U.S. PATENT DOCUMENTS 3,852,803 A * 12/1974 Walmet et al. ................ 257/715
4,037,014 A *  7/1977 Gittleman .................... 428/331
(Continued)

FOREIGN PATENT DOCUMENTS

FR        2 727 790 A1    6/1996
WO    WO 2004/042828 A2   5/2004
(Continued)

OTHER PUBLICATIONS

International Search Report for PCT/FR2010/050860, mailed Aug. 20, 2010.
(Continued)

*Primary Examiner* — Susan D Leong
(74) *Attorney, Agent, or Firm* — Wolf, Greenfield & Sacks, P.C.

(57) ABSTRACT

The present disclosure relates to a hybrid solar receiver that generates electricity and heat simultaneously. The solar receiver comprises photovoltaic cells for converting concentrated light on the cells into electricity. The receiver also includes a heat pipe having a heat discharge area that serves as an evaporator for discharging heat accumulated on the photovoltaic cells to a dissipation area. A dual-function interface layer is positioned between the photovoltaic cells and the heat pipe. The interface layer electrically insulates the photovoltaic cells from the heat pipe and instantaneously transfer the heat accumulated on photovoltaic cells to liquid coolant in the heat pipe. A surface of the photovoltaic cells is coated with an encapsulation layer. A transparent plate is deposited on the encapsulation layer.

19 Claims, 7 Drawing Sheets

(51) Int. Cl.

| | | |
|---|---|---|
| *F28D 15/02* | (2006.01) | |
| *F28D 21/00* | (2006.01) | |
| *F24J 2/06* | (2006.01) | |
| *F24J 2/07* | (2006.01) | |
| *F28D 15/04* | (2006.01) | |
| *H01L 31/054* | (2014.01) | |
| *H02S 40/44* | (2014.01) | |

(52) U.S. Cl.
CPC ............ *F28D 15/0275* (2013.01); *F28D 15/04* (2013.01); *Y02B 10/10* (2013.01); *Y02B 10/20* (2013.01); *Y02B 10/70* (2013.01); *Y02E 10/41* (2013.01); *Y02E 10/44* (2013.01); *Y02E 10/52* (2013.01); *Y02E 10/60* (2013.01); *H01L 31/054* (2014.12); *H02S 40/44* (2014.12)

(56) References Cited

U.S. PATENT DOCUMENTS

| | | | | |
|---|---|---|---|---|
| 4,320,246 | A * | 3/1982 | Russell | 136/248 |
| 4,380,112 | A * | 4/1983 | Little | 438/64 |
| 4,448,028 | A * | 5/1984 | Chao et al. | 62/3.3 |
| 4,548,258 | A * | 10/1985 | Nelson et al. | 165/104.21 |
| 4,686,961 | A | 8/1987 | Garrison | |
| 2002/0020440 | A1* | 2/2002 | Yoshimine et al. | 136/251 |
| 2002/0062649 | A1* | 5/2002 | Ohkubo et al. | 62/3.7 |
| 2004/0211569 | A1* | 10/2004 | Vinegar et al. | 166/380 |
| 2004/0219039 | A1* | 11/2004 | Watt | 417/411 |
| 2007/0028960 | A1* | 2/2007 | Royne et al. | 136/259 |
| 2008/0257335 | A1* | 10/2008 | Lowstuter | 126/605 |
| 2010/0101756 | A1* | 4/2010 | Chu et al. | 165/80.3 |

FOREIGN PATENT DOCUMENTS

| | | |
|---|---|---|
| WO | WO 2005/006452 A1 | 1/2005 |
| WO | WO 2006/038508 A1 | 4/2006 |
| WO | WO 2008/132300 A2 | 11/2008 |

OTHER PUBLICATIONS

Coventry, Performance of a concentrating photovoltaic/thermal solar collector. Solar Energy. 2005;78(2):211-22.

Rosell et al., Design and simulation of a low concentrating photovoltaic/thermal system. Energy Conversion and Management. 2005;46(18-19):3034-46.

Tiwari et al., Performance evaluation of hybrid PV/thermal water/air heating system: A parametric study. Renewable Energy. 2006;31(15):2460-74.

Vivar et al., Large-Area Si-Cell Encapsulation for Concentrator Systems: Review of Critical Points and New Proposals for the Third Generation of Euclides. Conference Record of the 2006 IEEE 4th World Conference on Photovoltaic Energey Conversion. Waikola, HI. May 7, 2006-May 12, 2006. IEEE. 2006:621-24.

\* cited by examiner

HYBRID SOLAR RECEIVER AND CONCENTRATING SOLAR SYSTEM COMPRISING THE SAME

RELATED APPLICATIONS

The present application is a national stage filing under 35 U.S.C. §371 of international PCT application, PCT/FR2010/050860, filed May 5, 2010, which claims priority to French application, number 0953028, filed May 6, 2009, each of which is incorporated herein by reference.

SUMMARY OF THE INVENTION

The present invention relates to a hybrid (photovoltaic and thermal) solar receiver designed to generate electricity and heat simultaneously by optimising the surface area of the photovoltaic cells used and which is especially suitable for domestic use.

BACKGROUND OF THE INVENTION

Against the background of economic growth, the energy sector must, on an international scale, keep pace with increasing demand for energy despite increasingly scarce resources whilst also responding to the dangers of climate change caused by the emission of greenhouse gases. Changes in the technologies that are used and the shift from conventional to renewable energy sources will obviously depend on the kilowatt hour price of the energy produced.

Nowadays, with on-going improvements being made, the efficiency of solar photovoltaic panels is roughly 15%. This efficiency is obviously still low and the price of the electricity produced is still higher than that of electricity produced using traditional methods—this often means that solar photovoltaic projects are only viable because they are subsidised. There are now hybrid solar receivers designed to reduce the cost of solar photovoltaic technology and to recover a portion of the heat that is to be distributed.

Document FR 2 727 790 relates to a hybrid photovoltaic and solar thermal module. A photovoltaic panel is used to produce electricity, and, at the same time, gas is fed underneath the photovoltaic panel in order to cool it. The heated gas releases its heat as it flows through a heat exchanger. The advantage of such a receiver is the fact that it makes it possible to extract and recover a portion of the heat that accumulates on the photovoltaic panel with the blower being powered by a portion of the electricity produced by the photovoltaic panel. However, the drawback is that the flow of gas used to extract the heat may not remove accumulated heat from the photovoltaic panel fast enough or sufficiently and overall efficiency is therefore not high and this limits the use of the system.

Document WO 2006/038508 describes a hybrid solar thermal/electricity generating system which uses the evaporator part of a heat pipe in order to recover the heat that accumulates on the solar photovoltaic panel. The heat pipe has a 2-plate structure in which there is a meandering hole through which a refrigerant fluid flows. The advantage of this system is that the high thermal flux transferred by the heat pipe makes it possible to keep the photovoltaic panel at a low temperature. Nevertheless, this system is the result of simply superposing a conventional photovoltaic panel and a heat pipe: the dissipation of heat from the photovoltaic panel is not optimised due to the high thermal resistance of the rear face of the photovoltaic panel which is formed by a layer of a copolymer of ethylene-vinyl acetate (referred to hereafter as "EVA") and a co-laminated layer of polyvinyl fluoride (PVF) and polyethylene terephthalate marketed under the brand name "TEDLAR®". In addition, the meandering hole in the heat pipe is provided in order to increase the heat exchange surface but this structure limits the circulation of the heat transfer fluid through the heat pipe. Such a system can only function at low solar intensity levels because when the solar intensity is high, the meandering hole prevents circulation of the heat transfer fluid towards the condenser and, ultimately, the heat pipe cannot operate correctly. Finally, with a 2-plate structure that has a meandering hole, the heat exchange surface of the heat pipe is independent of the surface of the photovoltaic cells and there is a risk that the temperature on the surface of the photovoltaic cells will not be homogeneous.

The current problem with hybrid solar thermal/electricity receivers is that there is a conflict between the average effective temperature of the photovoltaic cells and that of the thermal receiver. In fact, most photovoltaic cells operate more efficiently when their temperature is about the same as that of their surroundings, whereas a higher temperature is often needed in order to obtain good thermal efficiency. Because of the relatively low intensity of the sun's rays and the low efficiency of photovoltaic cells (approximately 15%), if one increases the average temperature of the photovoltaic cells in an attempt to recover high-temperature thermal energy, the peak power of the photovoltaic cells drops sharply (0.4%/° C.) and generating efficiency is even more adversely affected. Consequently, in order to avoid the problem of photovoltaic cells overheating, the most widely known solution is to cool photovoltaic cells by natural or artificial ventilation located underneath the photovoltaic panel with this heat then not being recovered but being released into the environment.

To sum up, hybrid solar photovoltaic electricity/heat receivers are juxtaposed devices that do not make it possible to optimise the simultaneous generation of electricity and heat using solar radiation.

In addition, another economic aspect plays an important role in solar energy products and the technology that is used. In conventional solar photovoltaic panels, the photovoltaic cells account for roughly 70% of the total cost of a panel. Using the silicon in the photovoltaic cell more efficiently helps reduce the total cost of the panel. Solar concentrator technology is a way of reducing the surface area of photovoltaic cells that is needed and hence the quantity of silicon that is required. However, concentration results in a very significant increase in the temperature of the photovoltaic cell, to the extent that the efficiency of the cells is only around 15% and 85% of the solar radiation is dissipated as heat. In addition, as stated above, a photovoltaic cell operates more efficiently when its temperature is approximately the same as the ambient temperature (except cells that use amorphous silicon). Consequently, heat must be dissipated in order to maintain the temperature of the photovoltaic cell and prevent this temperature from increasing to values that adversely affect the cell's efficiency.

To solve the problem of possible overheating in non-concentrating hybrid solar systems, the solution is often to bond a heat exchanger directly underneath the photovoltaic panel. However, the layers underneath the photovoltaic cells in a photovoltaic panel consist of materials that have a very high thermal resistance, such as EVA and TEDLAR®. These layers are components that are essential to a conventional solar photovoltaic panel and cannot be removed. Given the fact that the insolation intensity is relatively low, the heat that needs to be dissipated is not very great and the ventilation underneath a conventional photovoltaic panel is sufficient to control any overheating.

In contrast, in a concentrating solar photovoltaic system, the problem of photovoltaic cells overheating is crucial: the solution that is classically adopted is to combine a heat exchanger with a heat exchange surface that is much larger than that of the photovoltaic cells. The heat exchanger is placed underneath the photovoltaic cells with a heat transfer fluid that circulates inside it. Because the surface of the heat exchanger is very large and its heat exchange capacity per unit of surface area is not high, the temperature of the heat transfer fluid therefore remains relatively low.

Document WO 2004/042828 relates to such a system for air cooling a concentrating photovoltaic system down to ambient temperature. In this system, the photovoltaic cells are attached to a special-shaped heat pipe by an adhesive thermal conductivity layer, an intermediate metallic layer and an elastic plate or by an adhesive thermal conductivity layer, an intermediate metallic layer, and an adhesive thermal conductivity layer (or a layer of solder) and an elastic plate. A system like this has many disadvantages: firstly, the photovoltaic cells are not protected against the air and humidity and can therefore corrode; moreover, given that the solar radiation is concentrated, the electrical current produced is high and there is a risk of electrical conduction between the cells and the heat pipe because the intermediate layers are only thermal conductivity layers and metallic layers (electrically conductive); then, the intermediate layers are mechanically attached to the heat pipe by an elastic plate and this poses a mechanical problem on the photovoltaic cells because there is a risk of the photovoltaic cells being crushed by the differential force produced by a non-uniform temperature; finally, this system is only used to cool the cells using air with a considerable heat exchange surface and cannot produce a warm liquid coolant.

SUMMARY OF THE INVENTION

The object of the invention is to propose an innovative solution that solves the problem of the inverse relationship between the temperature and the efficiency of photovoltaic cells in a concentrating solar photovoltaic system that minimises the surface of the photovoltaic material (silicon) and which, at the same time, makes it possible to produce heat at a temperature that is immediately suitable for producing hot water for domestic use in a hybrid photovoltaic and thermal solar receiver that simultaneously produces electricity and heat in a particularly efficient way.

According to the invention, the hybrid solar receiver designed for concentrating solar systems for simultaneously generating electricity and heat is of the type that comprises photovoltaic cells for converting the sun's rays concentrated on said cells into electricity and a heat pipe for discharging the heat accumulated on the photovoltaic cells via a liquid coolant and is distinctive in that:

- the photovoltaic cells have a front face (S1) in order to collect the concentrated sun's rays and a rear face (S2) on the reverse of face (S1);
- the heat pipe has a heat discharge area that serves as an evaporator for discharging the heat accumulated on the photovoltaic cells and a dissipation area for dissipating the heat that it absorbs, the entire rear face of the photovoltaic cells being in contact with the heat discharge area of the heat pipe via a dual-function interface layer that electrically insulates the photovoltaic cells from the heat pipe in order to instantaneously transfer the heat accumulated on the photovoltaic cells to the liquid coolant in the heat pipe;
- the entire surface of the photovoltaic cells, except for the rear face (S2), is coated with a layer of an encapsulation material.
- a transparent plate is placed on the encapsulation layer;
- the assembly formed by the transparent plate, the encapsulation layer, the photovoltaic cells and the interface layer is fixed to the heat pipe.

Thus, the invention has a particular advantage where heat pipes are used in order to discharge heat that is present in photovoltaic cells. A heat pipe is a device that transports large amounts of heat with small temperature gradients. These include, for instance, capillary-pumped heat pipes having a capillary structure consisting of grooves that are machined into their metal wall. A heat pipe is in the form of a hermetic enclosure that encloses a liquid coolant. A heat pipe is divided into three areas: a heat discharge area (also often referred to as an "evaporation area" or "evaporator") located where heat is gained, an adiabatic area (also referred to as a "neutral area") which can be omitted in some cases because it is not always necessary, and a dissipation area (also often referred to as a "condenser") situated at the level of the cold source. The coolant flows through these various areas, uses the latent phase-change heat and circulates in a thermodynamically closed system. The cycle consists of four steps. When the evaporator of the heat pipe is in contact with the heat source, i.e. photovoltaic cells that are operating, the coolant, which is located in the capillary structure, evaporates and absorbs heat equivalent to the latent change-of-state heat. This phase change results in a pressure increase in the vapour phase which causes vapour to flow towards the condensation area. The vapour condenses and then releases all the heat energy that was absorbed during vaporisation. To ensure passive operation of the system, the liquid coolant must be returned to the evaporator by a propelling force. This force is provided by gravity acting on the heat transfer fluid. This means it is sufficient to position the condensation area above the evaporation area. In an inverted configuration, this role is played by capillary action. To achieve this, the inner wall of the heat pipe is covered in a wick. The fluid then develops a curved meniscus which is responsible for the occurrence of a pressure difference between these two phases. This pressure difference then makes it possible to compensate for pressure losses that occur along the heat pipe in order to ensure the liquid is returned from the condensation area to the evaporation area.

Thus, assuming they all have the same geometry, all the grooves behave in an identical fashion and must allow the liquid to develop a capillary pressure difference that is capable of compensating for pressure losses along the heat pipe.

One attractive feature of heat pipes is their ability to transfer significant thermal flux with a very small temperature gradient. Besides this exceptional property, heat pipes also have other advantages such as being light, extremely reliable, flexible in terms of geometry and also the fact that they are a passive system. In addition to these properties:

- they are able to transport considerable amounts of heat. This makes them very suitable for discharging the heat released by photovoltaic cells, especially when the latter are used with concentrator systems.
- they are highly thermally conductive. This property enables them to make the temperature of elements with which they are in contact uniform. This is how the temperature over the entire surface of the photovoltaic cells is kept extremely homogeneous. This greatly improves the reliability of the cells and reduces, in particular, the risks of localised differential expansion and guarantees stable operation.

rapid thermal transfer. This makes it possible to control the temperature of the photovoltaic cells.

In other words, the invention is applicable to a process that has a source of intense heat, due to the concentration of solar energy by solar concentrators, and has relatively fine photovoltaic cells (typically from 100 to 180 µm). The cells are also very fragile because of differential expansion caused by differences in temperature at various points on the surface of the cell. In conventional devices, this phenomenon quickly causes material fatigue which results in the material failing. In fact, if the temperature difference on a photovoltaic cell exceeds 5° C., the service life of the cell is compromised. Consequently, the invention makes it possible to obtain greater temperature homogeneity on the cells and this increases their service life and operational stability.

According to other aspects of the invention:
- the interface layer has a thermal resistance of less than $7.10 1^{-4}$ m$^2$·K/W.
- the material from which the dual-function interface layer is made is selected from ceramic materials, combinations of EVA and a ceramic material and silicon pastes. Advantageously, the ceramic material is selected from aluminium nitride (AlN), beryllium oxide (BeO) and alumina (Al$_2$O$_3$).
- the material from which the encapsulation layer is made is selected from a group comprising EVA, PVB, EVA doped with metallic particles, and PVB doped with metallic particles.
- the dissipation area of the heat pipe has fins on its surface in order to increase the heat exchange surface and the dissipation area is connected to an extraction heat exchanger that is fed with a heat transfer fluid.
- the entire surface of the heat pipe, except the surface that is in contact with the rear face of the photovoltaic cells and the surface of the dissipation area, is covered in a material having a radiation absorption coefficient that is greater than its radiation emission coefficient.
- the outer section of the heat discharge area is semi-circular with a planar surface and the rear face of the photovoltaic cells faces this planar surface of the heat discharge area to which it is attached by the dual-function interface layer.
- the outer section of the heat discharge area is rectangular, one of the four planar surfaces and the rear face of the photovoltaic cells are in contact through the dual-function interface layer.
- the outer section of the heat discharge area is circular, the rear face of the photovoltaic cells is in contact with the outer surface of the cylindrical heat discharge area via the dual-function interface layer.
- the heat pipe has a fin on each side of the heat discharge area.
- the transparent plate has a non-reflective surface treatment.
- the photovoltaic cells cover the entire surface of the heat discharge area.
- the heat discharge area of the heat pipe is enclosed in a vacuum tube in order to reduce thermal losses.

The invention also relates to a solar system comprising a linear-concentrating solar concentrator and a hybrid solar receiver as described above, characterised in that the electricity needed to power a drive motor in order to track the position of the sun and to circulate the heat transfer fluid is provided by the system itself.

DESCRIPTION OF THE DRAWINGS

The invention will be more readily understandable by reading the following description which refers to the accompanying drawings in which identical references denote identical components and in which:

FIG. 3b is a schematic cross-sectional view along line A-A in FIG. 3a;

FIG. 4b is a schematic cross-sectional view along line A-A in FIG. 4a;

FIG. 5b is a schematic cross-sectional view along line A-A in FIG. 5a;

FIG. 6b is a schematic cross-sectional view along line A-A in FIG. 6a.

DESCRIPTION OF THE PREFERRED EMBODIMENTS

The present invention provides a simple, effective solution for reducing the cost of both technology and solar energy through solar concentration and simultaneously generating electricity and heat from 45° C. to 150° C. in order to meet most day-to-day needs.

The hybrid solar receiver according to the invention is designed, in particular, for linear-concentrating solar systems. A solar system is said to be a "linear-concentrating" system if the sun's rays are concentrated in a line or a small linear strip: these include, for instance, cylindrical-parabolic concentrating solar systems, Fresnel reflector concentrating solar systems, cylindrical lens concentrating solar systems or a solar concentrator as described in document WO2008/132300. If the photovoltaic cells are applied directly onto the concentration area of such a concentrator which can increase the intensity of light by a factor of roughly 20 by concentrating it, conventional solutions for discharging the heat that is produced turn out to be completely inadequate for avoiding overheating of the photovoltaic cells.

The invention relates to a hybrid solar receiver that is especially suitable for using such a linear concentrator but also has applications in other concentrating systems.

Figure 1:
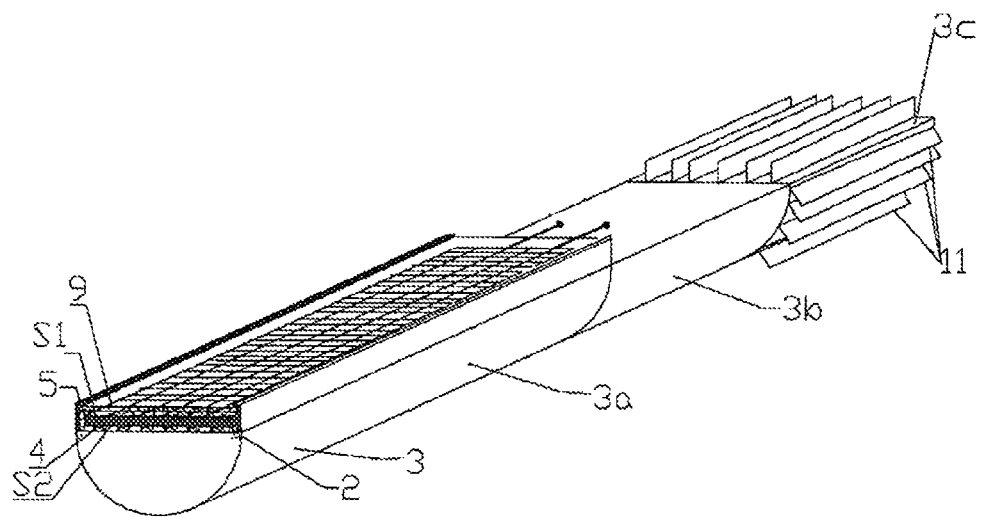
FIG. 1 is a schematic perspective view of one embodiment of a hybrid solar receiver according to the invention designed for linear-concentrating solar systems with a heat pipe having a semi-circular cross-section.

To achieve this, according to the present invention and referring to FIG. 1, the hybrid solar receiver designed, in particular, for linear-concentrating solar systems of the above-mentioned type comprises photovoltaic cells (2) which have a front face (S1) that is exposed to the sun's concentrated rays and a rear face (S2) for discharging accumulated heat. A heat pipe (3) has a heat discharge area (3a) that is used to extract the heat accumulated on photovoltaic cells (2) and a dissipation area (3c) for dissipating the heat that it absorbs: the entire rear face of the cells (S2) is placed in contact with heat discharge area (3a) of heat pipe (3) via a dual-function interface layer (4) which electrically insulates the photovoltaic cells (2) from the heat pipe (3) that also has a thermal resistance of less than $7.10^{-4}$ m$^2$K/W which makes it possible to instantaneously transfer the heat accumulated on photovoltaic cells (2). This electrically insulating and thermally conducting interface layer (4) is a layer of ceramic material, for example a layer consisting of epoxide charged with aluminium nitride (AlN) or a layer of beryllium oxide (BeO) or silicone. The entire surface of photovoltaic cells (2), except for the rear face (S2) which is coated with dual-function interface layer (4) is covered by encapsulation layer (5). A transparent plate (9) is placed on encapsulation layer (5) and transparent plate (9) is attached to heat exchanger (3) which has an air space around said photovoltaic cells (2) thanks to means that are within the grasp of those skilled in the art. Dissipation area (3c) has fins (11) on its surface in order to increase the heat exchange surface; dissipation area (3c) is connected to an extraction heat exchanger (7) that is fed with a heat transfer fluid that is cold when it enters (7a) and warm when it exits (7b), thus discharging the heat absorbed by heat pipe (3). This way one can recover a portion of the energy that is transferred to the heat pipe by the photovoltaic cells in order to exploit it, for instance in order to power a drive motor that is used to track the position of the sun or to pump the heat transfer fluid in the extraction circuit.

Conventionally, photovoltaic cells (2) are either formed by multicrystalline, monocrystalline or amorphous silicon, one or more thin layers of silicon, an amorphous silicon and crystalline silicon-based heterostructure or by nanocrystalline silicon based either on cadmium telluride and copper indium selenide (CIS) or based on organic materials. They are connected either in series or in parallel or coupled in series and in parallel and are equipped with two electrical conductors in order to conduct the electricity that is produced out of the cell.

Encapsulation layer (5) can consist of a membrane made of a copolymer of ethylene vinyl-acetate (EVA), polyvinyl butyral (PVB) or doped EVA (i.e. doped with metal particles in order to increase its thermal conductivity without creating any electrical conductivity) or doped PVB (doped with metal particles in order to increase its thermal conductivity without creating any electrical conductivity).

Transparent plate (9) can be made of glass, toughened glass or plastic. The surface of transparent plate (9) is treated to make it non-reflective so that as much radiation as possible reaches the photovoltaic cells.

Dual-function interface layer (4) can be made of the same material as encapsulation layer (5) for a solar concentration rate of less than 5 where the heat to be dissipated and temperature-related thermal expansion are not very significant. Dual-function interface layer (4) can be a double layer of encapsulation layer (5) and an above-mentioned ceramic layer for a solar concentration rate greater than 5 where the heat to be dissipated and temperature-related thermal expansion are more significant. However, layer (4) is preferably an above-mentioned ceramic layer.

Dissipation area (3c) is provided with fins (11) in order to make heat exchange more intense and fins (11) are appropriately shaped to enhance heat exchange as required.

The entire surface of the heat pipe, except the surface that is in contact with rear face (S2) of the cells and the surface of dissipation area (3c), is covered with a material having a radiation absorption coefficient that is greater than its radiation emission coefficient.

Figure 2A:
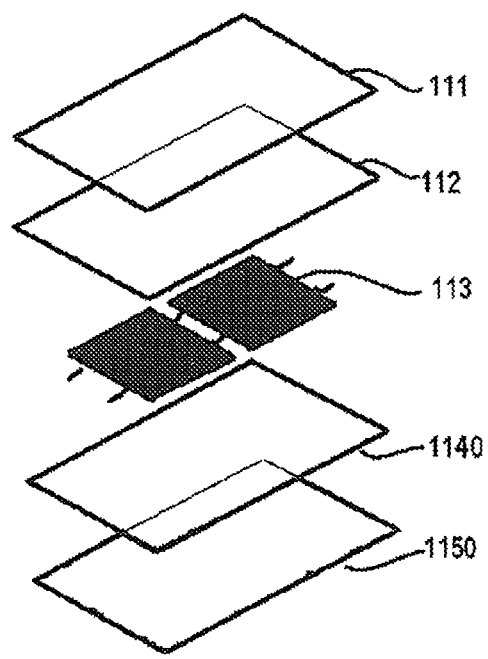
FIG. 2a is an exploded schematic view of the components of a conventional solar photovoltaic panel.

As shown in FIG. 2a, the superposed layers in a conventional solar photovoltaic module according to the prior art are as follows: (111) Toughened glass; (112) and (1140) Encapsulation sheets made of EVA; (113) Photovoltaic cells; (1150) TPT (Tedlar®—Polyethylene terephthalate—Tedlar®) laminate.

In such a conventional solar photovoltaic panel measuring 1482×676 mm, the thicknesses and roles of its constituent layers can be described as follows:
  (111) Toughened glass, 3 mm thick: Roles: 1) Protects the EVA against external air and humidity; 2) Acts as a cover in order to protect the PV cell against the elements, e.g. hail; 3) Ensures the transmission of light; —112 EVA encapsulation sheet, 0.4 mm thick: Roles: 1) Encapsulates the PV cell; 2) Bonds the toughened glass layer to the PV cell; 3) Compensates for expansion of the PV cell in the event of temperature fluctuations; 4) Ensures the transmission of light; 5) Very high electrical resistivity in order to act as an extremely good electrical insulator;
  (113) Photovoltaic cells: Generate electricity;
  (1140) EVA encapsulation sheet, 0.4 mm thick: Roles 1) Encapsulates the PV cell; 2) Bonds the PV cell to the TPT layer; 3) Compensates for expansion of the PV cell in the event of temperature fluctuations;
  (1150) TPT laminate, 0.25 mm thick: Role: Protects against humidity.

Figure 2B:
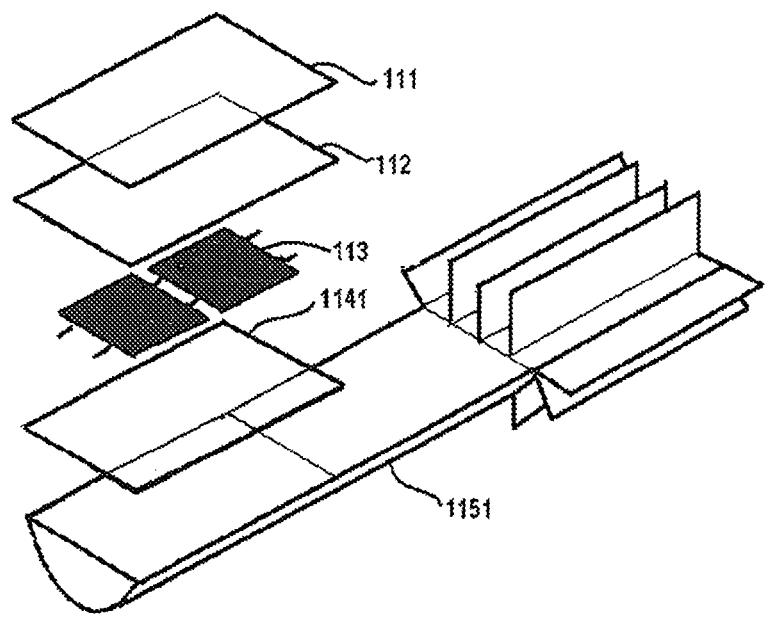
FIG. 2b is an exploded schematic view of the components of a hybrid solar panel according to the invention.

In contrast, as shown in FIG. 2b, the superposed layers in a hybrid solar receiver according to the invention comprise: (111) Toughened glass; (112) EVA encapsulation sheet; (113) Photovoltaic cells; (1141) EVA encapsulation sheet and/or ceramic laminate with low thermal resistance (less than $7.10^{-4}$ m$^2$ K/W) and electrically insulating; or silicone paste; (1151) Heat pipe for discharging the heat accumulated on the photovoltaic cells.

In such a hybrid solar receiver according to the invention, measuring 1500×20 mm, the thicknesses and roles of its constituent layers can be described as follows:
  (111) Toughened glass, less than 2 mm thick: Roles: 1) Protects the EVA against air and humidity; 2) Acts as a cover in order to protect the PV cell against the elements, e.g. hail; 3) Ensures the transmission of light;
  (112) EVA encapsulation sheet, 0.4 mm thick: Roles: 1) Encapsulates the PV cell; 2) Bonds the toughened glass layer to the PV cell; 3) Compensates for expansion of the PV cell in the event of temperature fluctuations; 4) Ensures the transmission of light; 5) Very high electrical resistivity in order to act as an extremely good electrical insulator;
  (113) Photovoltaic cells: 10 Generate electricity; 2) Generate heat;
  (1141) EVA encapsulation layer and/or ceramic laminate: Roles: 1) Encapsulates the PV cell; 2) Bonds the PV cell to the heat pipe; 3) Compensates for expansion of the PV cell in the event of temperature fluctuations; 4) Very high electrical resistivity in order to act as an extremely good electrical insulator; 5) Conducts heat thanks to good thermal conductivity;
  (1151) Semi-cylindrical heat pipe having a diameter of 20 mm, 1800 mm long: Roles: 1) Cools the PV cells; 2)

Transports heat; 3) Protects the EVA and photovoltaic cells assembly against humidity.

This demonstrates that the thicknesses and the roles of the constituent layers in the two systems are not identical, even though they are made of the same materials; this is a result of the physical characteristics of the materials that are selected to allow dissipation of heat in such a concentrating solar system and also the characteristic values of the various materials used which are stated below (general values at a temperature of 20° C.):

| | Thermal conductivity* $\lambda$ [W · m$^{-1}$ · K$^{-1}$] | Thickness mm | Thermal resistance e/$\lambda$ [m$^2$ · K · W$^{-1}$] |
|---|---|---|---|
| Glass | 1.1 | 3 | $2 \cdot 73 \cdot 10^{-3}$ |
| EVA | 0.6 | 0.4 | $6 \cdot 7 \cdot 10^{-4}$ |
| PV silicon | 150 | 0.18 | $1 \cdot 2 \cdot 10^{-6}$ |
| Silicone paste | 1.5 | 0.2 | $1 \cdot 3 \cdot 10^{-4}$ |
| Al$_2$O$_3$ | 39 | 0.2 | $5 \cdot 1 \cdot 10^{-6}$ |
| BeO | 218 | 0.2 | $9 \cdot 2 \cdot 10^{-7}$ |
| AlN | 170 | 0.2 | $1 \cdot 2 \cdot 10^{-6}$ |
| TEDLAR ® | 0.033 | 0.254 | $7 \cdot 7 \cdot 10^{-3}$ |

Assuming the above values, in a conventional photovoltaic panel, the total of the thermal resistances equals:
On the front face of a PV cell:
Resistances (glass+EVA)=$2.73.10^{-3}$+$6.7.10^{-4}$= $0.4.10^{-3}$[m$^2$·K·W$^{-1}$] for a glass thickness of 3 mm ($3.10^{-3}$ m) and an EVA thickness of 0.4 mm ($4.10^{-4}$ m);
On the rear face of a PV cell
Resistances (EVA+TEDLAR®)=$6.7.10^{-4}$+ $7.7.10^{-3}$=$8.37.10^{-3}$[m$^2$·K·W$^{-1}$] for an EVA thickness of 0.4 mm and a TEDLAR® thickness of 0.254 mm.

The thermal resistance on the rear face is 2.46 times higher than that on the front face. In practice, glass and TEDLAR® behave like thermal insulators.

If a conventional photovoltaic module was used in a linear-concentrating solar system having a concentration rate of 20 without discharging any heat, the temperature of the rear face would rise to over 750° C. and this would destroy the module. Even if a heat pipe is used to discharge heat, because of the extremely high thermal resistance of TEDLAR® ($7.7.10^{-3}$ m$^2$·K·W$^{-1}$ for a thickness of $2.54.10^{-4}$ m), the temperature on the rear face would still rise to above 200° C. and the module would be damaged.

One essential aspect of the invention is therefore to reduce the thermal resistance of the layer on the rear face of the photovoltaic cells and, to achieve this, remove the TEDLAR® layer and replace it by a layer of a material that has better thermal conductivity: without the TEDLAR® layer, the temperature of the rear face reaches 100° C. to 150° C. if heat is dissipated by a heat pipe. EVA is not an ideal material for conducting heat but it can nevertheless be retained. However, in a really optimal embodiment, the EVA layer would also be replaced by a material having a lower thermal resistance.

To sum up, the operational performance of a hybrid solar receiver according to the invention depends on the radiation concentration rate on the photovoltaic cells and the thermal resistance between the photovoltaic cell and the heat exchanger used to discharge heat accumulated in the area of the photovoltaic cells. For each solar radiation concentration rate, the choice of material for the intermediate layers and the material of the heat exchanger are appropriate for discharging heat from the cells by transferring it at a maximum temperature of around 90° C. to 120° C., this is a suitable temperature for domestic uses.

In one embodiment, taking into account the solar concentration rate of the concentrator, in order to collect all the sun's concentrated rays without increasing the diameter of heat pipe (3), one can add fins (10) to heat exchanger (3). The fin length does not exceed the size of the outer radius of heat pipe (3) in order to make sure that the temperature difference between the heat pipe and the edge of the fin is not excessively high. If this temperature difference does not exceed 5° C., one can place photovoltaic cells on fins (10) if necessary.

The hybrid solar receiver designed for linear-concentrating solar systems (1) according to the invention may have a tubular shape in order to seal the part where photovoltaic cells (2) are located and to diminish infrared thermal losses. The tube can be a simple vacuum tube. The tube can be a double-walled vacuum tube, the interior of which is negatively pressurised or filled with dry, oxygen-free air or an inert gas. The tube may contain desiccant or antioxidant products.

The electricity needed to power the servo motor in order to track the sun (tracking makes it possible to keep the solar radiation concentrated in a linear strip of photovoltaic cells regardless of the position of the sun relative to the receiver) and/or for pumping the heat transfer fluid in the heat pipe can be supplied by the actual receiver or by an electric storage battery.

The structure of the hybrid solar receiver designed for linear-concentrating solar systems (1) according to the invention has the following advantages:

the receiver uses a concentrating solar system and has a reduced surface area for collecting the sun's rays: the quantity of photovoltaic material required in order to collect the sun's rays is reduced significantly compared with systems with conventional, non-concentrating panels and the cost of investing in this material is lower.

the receiver produces electricity and, at the same time, makes it possible to recover heat in order to produce, in particular, domestic hot water. The receiver's overall efficiency is therefore higher and this makes it a very good solution for installations that have a limited surface exposed to the sun.

the receiver increases the heat that is to be dissipated from the surface of the cells. Because of this, it becomes more attractive to recover this heat in order to produce, for instance, domestic hot water at a high temperature.

according to the invention, the entire surface of the photovoltaic cells is in contact with the heat pipe's heat exchange surface. Using the heat pipe technique makes it possible to transfer heat instantaneously and thus allows quasi-isothermal operation. Because of this, the temperature of the entire surface of the photovoltaic cells is kept virtually uniform and there is therefore less risk of the photovoltaic cells failing due to stresses produced by temperature differences: the service life of the photovoltaic cells can therefore be much longer and can be guaranteed.

the thermal losses are proportional to the heat transfer surface and the photovoltaic efficiency is proportional to the solar radiation flux intensity. The invention uses a much smaller surface area to absorb the sun's rays, the photovoltaic cell efficiency is higher and thermal losses are smaller.

the surface for collecting the sun's rays is smaller compared with conventional solar photovoltaic panels and this reduces maintenance and servicing.

The joint between layers is very important because one must avoid trapping air and humidity between any two layers.

To achieve this, a method for manufacturing this hybrid solar receiver (1) according to the invention can be performed and involves the following steps:

1. A piece of aluminium nitride (AlN) ceramic having a parallelepiped shape and 2 to $6.10^{-4}$ m thick is polished to obtain a fineness of 0.15±0.3 μm, then cleaned in acetone and placed in a stove at 1200° C. for 12 hours with a controlled quantity of oxygen in order to obtain a 4 μm alumina ($Al_2O_3$) laminate. The ceramic is then cooled to 1000° C. at a cooling rate of 5° C. per minute, the ceramic is then transferred to a vacuum chamber.

2. A copper tube with a planar surface polished to 0.15±0.3 μm is then cleaned in acetone and heated to 1000° C. for an hour in normal air in order to obtain a 4 μm copper oxide ($Cu_2O$) laminate on the planar surface. The tube is then transferred to the vacuum chamber.

3. The pre-oxidised ceramic obtained from step 1 is placed on the pre-oxidised tube obtained from step 2; they are then reheated to a temperature higher than that of the copper and copper oxide eutectic system (i.e. approximately 1065° C.) but lower than the melting point of copper (i.e. 1084° C.) for 3 minutes in this vacuum chamber in order to obtain a strong $Cu-Cu_2O/Al_2O_3-AlN$ joint. They are then cooled 1000° C. at a cooling rate of 5° C. per minute before being cooled down to 120° C. at a cooling rate of 10° C. per minute.

4. The tube is then filled with heat transfer fluid and both its ends are closed in order to form a heat pipe using standard heat-pipe manufacturing methods.

5. A layer of EVA, the layer of photovoltaic cells and glass are deposited on the ceramic, they are then all heated to 120-150° C. in order to fuse the EVA and bond the parts together. The glass is fixed to the heat pipe using techniques familiar to those skilled in the art.

This method for manufacturing the receiver according to the invention is merely an example of an embodiment.

Figure 3A:
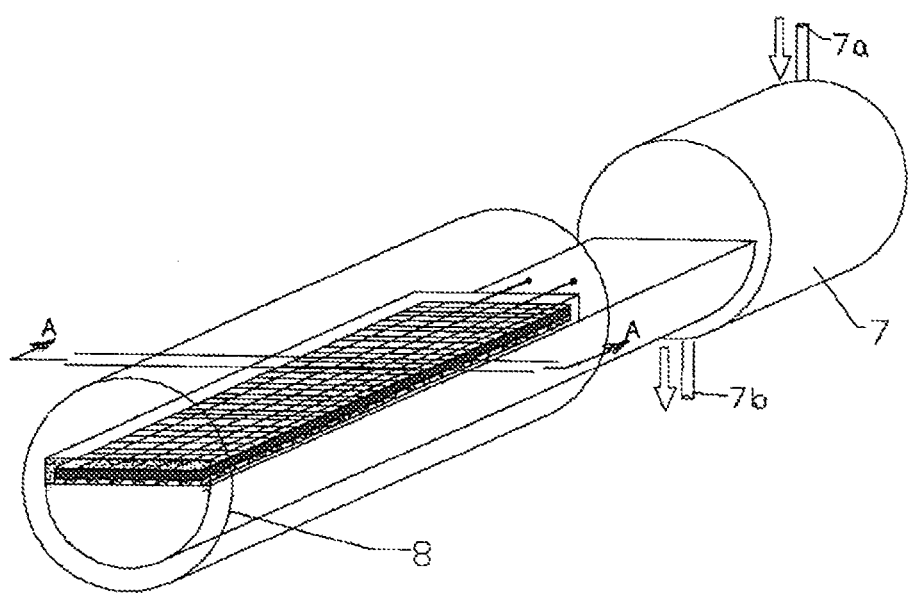
FIG. 3a is a schematic perspective view of a hybrid solar receiver designed for linear-concentrating solar systems as illustrated in FIG. 1 and having a closed tube and connecting with an extraction heat exchanger according to the invention.

Hybrid solar receiver (1) may have a closed tube (8) shape in order to seal the part where said photovoltaic cells (2) are located, as shown in FIG. 3a.

Figure 3B:
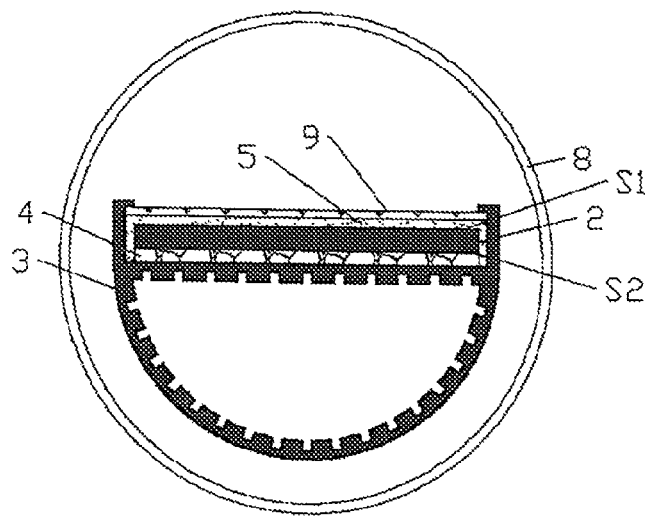

FIG. 3b shows a cross-section along line A-A in FIG. 3a. The internal structure of said heat pipe can have grooves acting as a capillary structure but it can also have other capillary structures (not shown) that make it possible to drain the thermal flux in order to make heat transfer more intense.

Figure 4A:
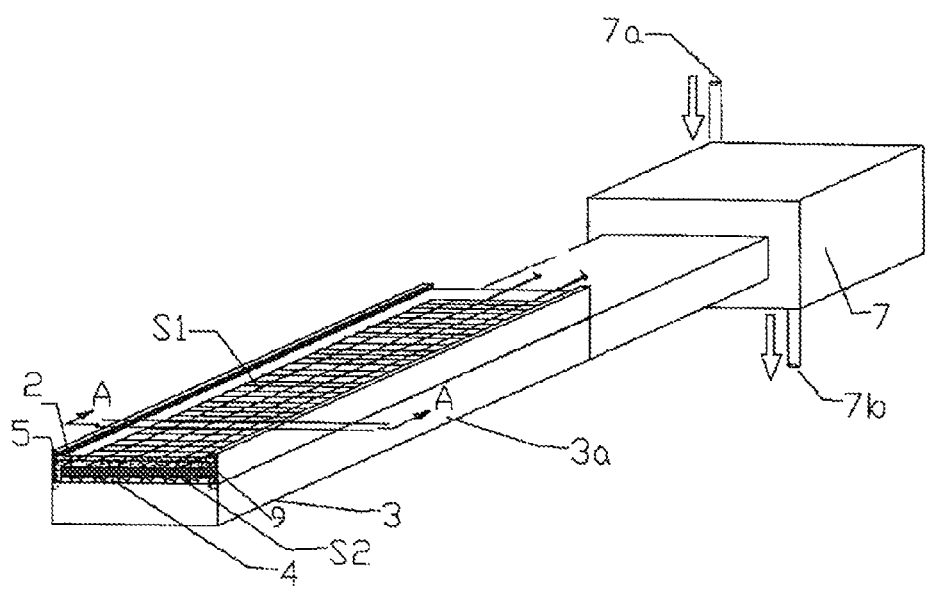
FIG. 4a is a schematic perspective view of one embodiment of a hybrid solar receiver designed for linear-concentrating solar systems with a heat pipe having a rectangular cross-section according to the invention.

FIG. 4a shows a second embodiment with a heat pipe having a rectangular cross-section. Heat discharge area (3a) has four planar surfaces and surface S2 is placed on and in contact with one of the four planar surfaces of heat discharge area (3a) of said heat pipe (3) via layer (4).

Figure 4B:
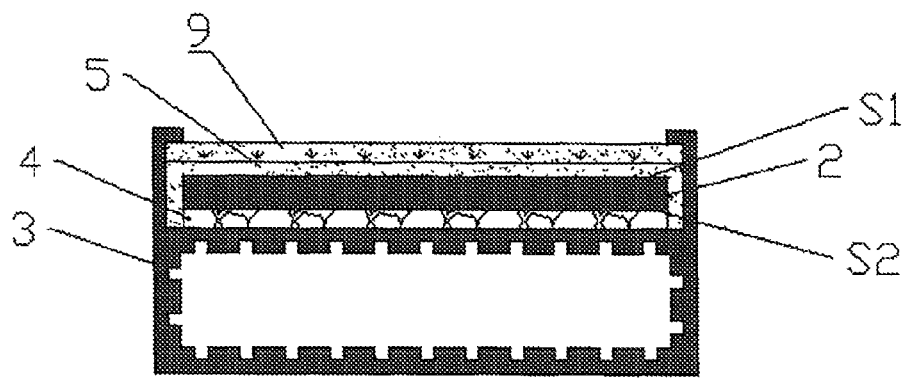

FIG. 4b shows a cross-section along line A-A in FIG. 4a. The internal structure of the heat pipe can have grooves acting as a capillary structure but it can also have other capillary structures (not shown) that make it possible to drain the thermal flux in order to make heat transfer more intense.

Figure 5A:
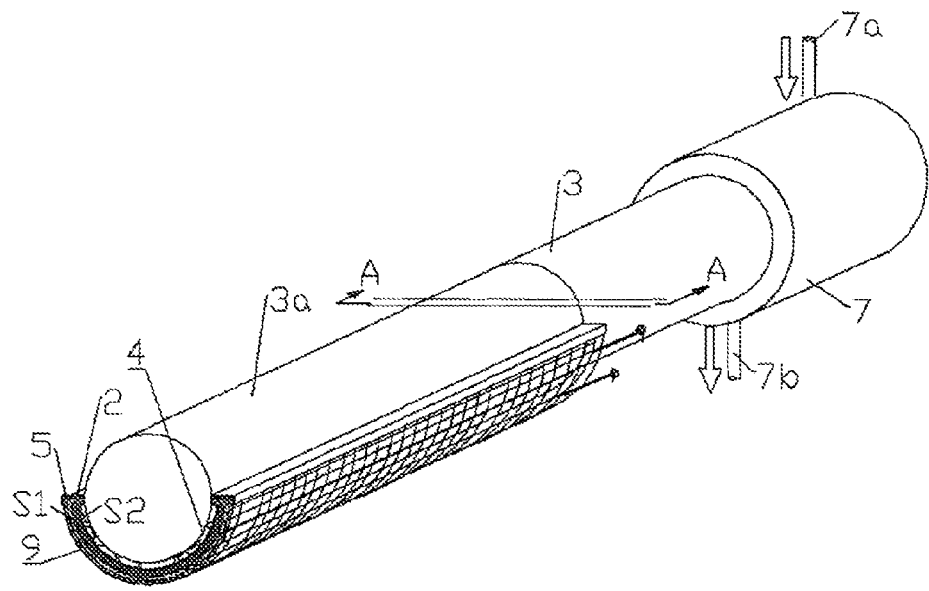
FIG. 5a is a schematic perspective view of one embodiment of a hybrid solar receiver designed for linear-concentrating solar systems with a heat pipe having a circular cross-section according to the invention.

FIG. 5a shows a third embodiment with a heat pipe having a circular cross-section. Heat discharge area (3a) is a cylinder and surface S2 is placed on and in contact with the cylindrical surface of heat discharge area (3a) via layer (4).

Figure 5B:
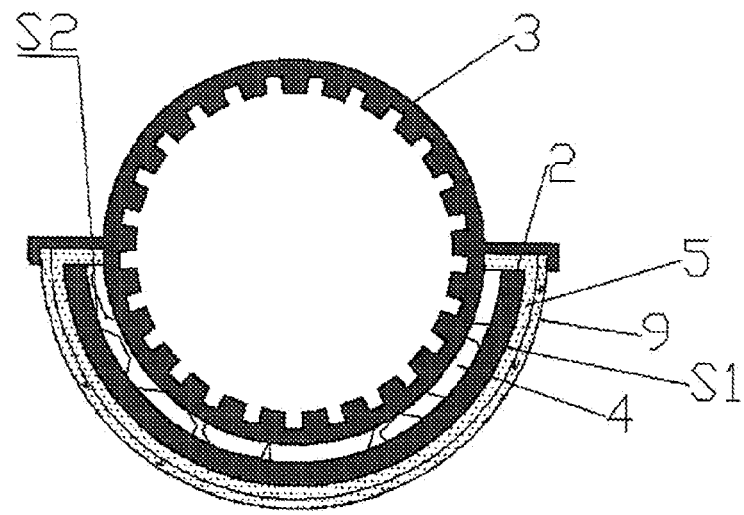

FIG. 5b shows a cross-section along line A-A in FIG. 5a. The internal structure of said heat pipe can have grooves acting as a capillary structure but it can also have other capillary structures (not shown) that make it possible to drain the thermal flux in order to make heat transfer more intense.

Figure 6A:
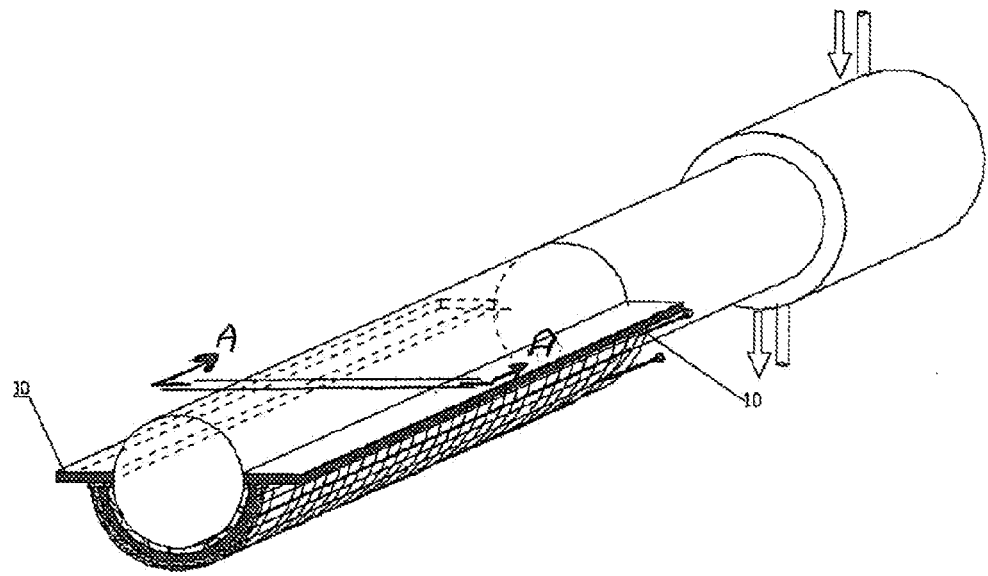
FIG. 6a is a schematic perspective view of one embodiment of a hybrid solar receiver designed for linear-concentrating solar systems with a heat pipe having a circular cross-section with fins according to the invention.
Figure 6B:
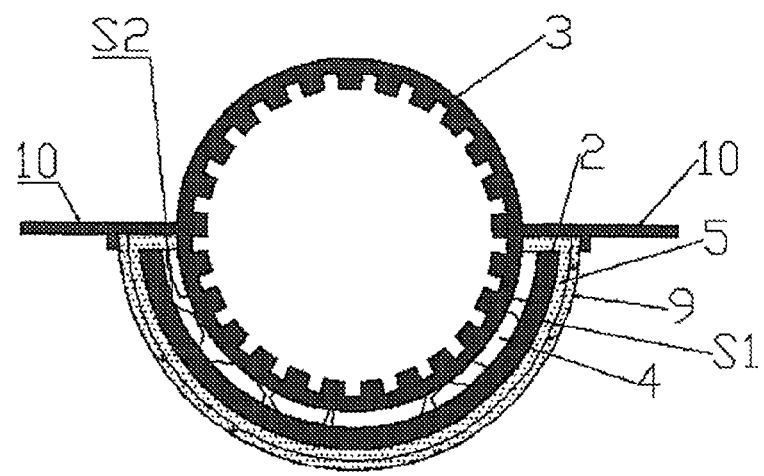

FIG. 6a shows another embodiment with a heat pipe having a circular cross-section and fins. Heat discharge area (3a) is a cylinder with one fin on each side of the tube. Surface (S2) is placed on and in contact with the cylindrical surface of heat discharge area (3a) via layer (4). Surface (S2) can be placed on and in contact with said fins. FIG. 6b shows a cross-section along line A-A in FIG. 6a. The internal structure of the heat pipe can have grooves acting as a capillary structure but it can also have other capillary structures (not shown) that make it possible to drain the thermal flux in order to make heat transfer more intense.

Figure 7A:
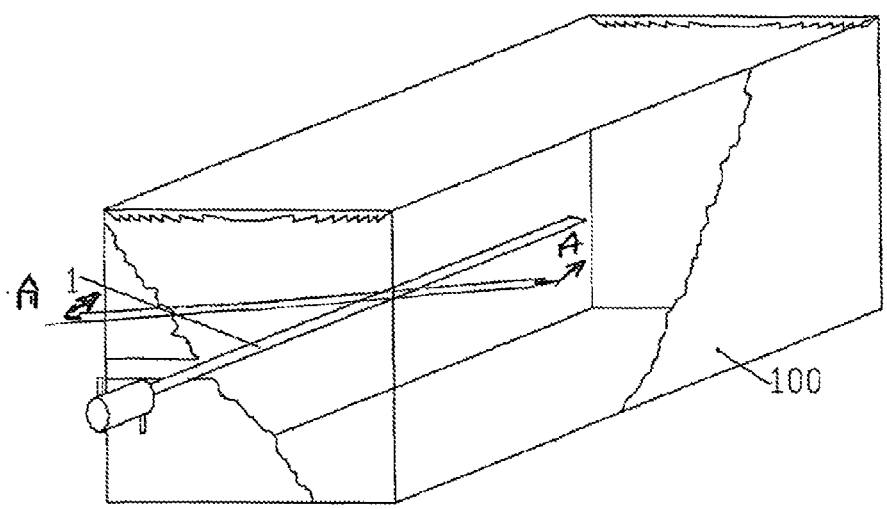
FIG. 7a is a schematic perspective view of an embodiment of a hybrid solar receiver according to the invention associated with a solar concentrator such as that described in document WO2008/132300.

FIG. 7a shows a hybrid solar receiver according to the invention comprising a solar concentrator (100) such as that described in document WO2008/132300. The sun concentrates the sun's rays on the Final Image Focus (FIF), the hybrid solar receiver according to the invention is located on the FIF and tracks the FIF's movement. The front face of the photovoltaic cells faces towards the bottom of the concentrator in order to collect the sun's concentrated rays.

Figure 7B:
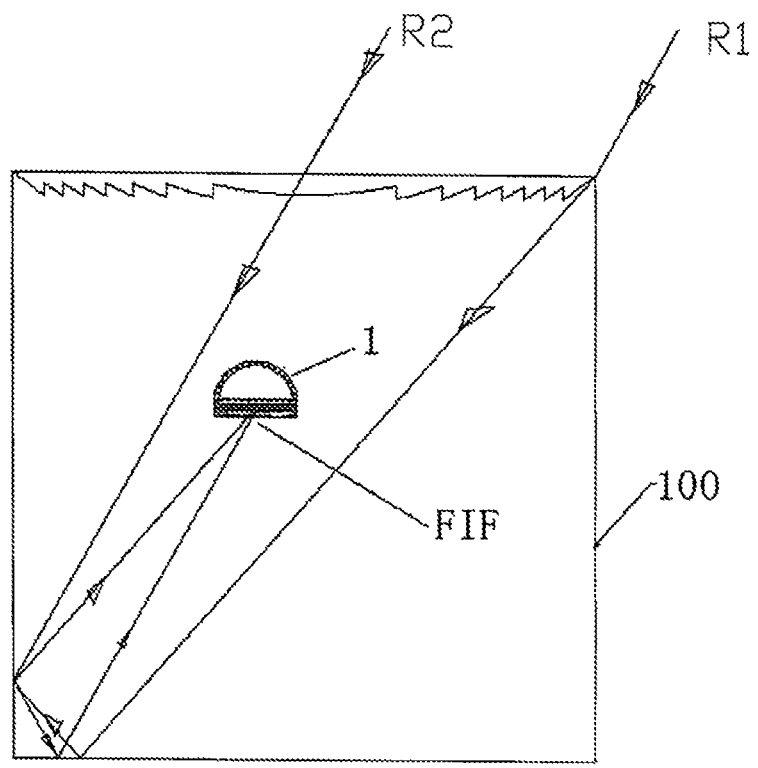
FIG. 7b is a schematic cross-sectional view along line A-A in FIG. 7a showing the path taken by a parallel beam of sunlight in such a concentrator.

FIG. 7b shows a cross-section along line A-A in FIG. 7a. A parallel beam of sunshine represented by rays R1 and R2 impinges on solar concentrator (100). The beam passes through the lens and is refracted, then it is reflected by the lateral mirrors and the bottom mirror and finally concentrated on the Final Image Focus (FIF) where the hybrid solar receiver (1) according to the invention is located.

By way of example, for a solar concentrator (100) as described in document WO2008/132300 having a surface area exposed to sunlight measuring 40 cm×100 cm, the solar radiation that impinges on the concentrator is concentrated on its final image focus in a strip measuring 2 cm×100 cm where the hybrid solar receiver is located. The hybrid solar receiver comprises a strip of photovoltaic cells having a surface area measuring 2 cm×100 cm and a heat pipe having a semi-circular cross-section whose heat discharge area (3a) has a surface that is in contact with the strip of cells which also measures 2 cm×100 cm and whose dissipation area (3c) is connected to a heat exchanger in order to discharge the condensed heat. The dimensions of the elements shown in FIG. 1 are, in greater detail as follows: dissipation area (3) is 15 cm long; the adiabatic area (3b) between heat discharge area (3a) and dissipation area (3c) is 15 cm long. The length of a heat pipe is 100 cm+15 cm+15 cm=130 cm. Obviously, these values are indicated merely by way of example, are not limitative and are intended to make the principle of the invention readily understandable.

The invention claimed is:

1. A hybrid solar receiver designed for concentrating solar systems for simultaneously generating electricity and heat, comprising:

an array of photovoltaic cells for converting light concentrated on the array of photovoltaic cells into electricity, the array of photovoltaic cells having a front face, for receiving the light, and a rear face located opposite the front face;

a heat pipe having an evaporation area including a channel for accommodating flow of a liquid coolant and for discharging heat accumulated at the array of photovoltaic cells via the liquid coolant, the rear face of the array of photovoltaic cells substantially conforming to a shape of an outer surface of the evaporation area and extending along a majority of a diameter of the evaporation area, the heat pipe having a dissipation area for dissipating heat absorbed by the array of photovoltaic cells;

a dual-function interface layer in contact with the rear face of the array of photovoltaic cells and in contact with the evaporation area of said heat pipe, the dual-function interface layer providing electrical insulation between the array of photovoltaic cells and the heat pipe, and transfer of heat accumulated by the array of photovoltaic cells to the liquid coolant of the heat pipe;

an encapsulation layer coating a surface of the array of photovoltaic cells; and
a transparent plate located on the encapsulation layer.

2. The hybrid solar receiver as claimed in claim 1, wherein the interface layer has a thermal resistance of less than $7.10^{-4}$ m²K/W.

3. The hybrid solar receiver as claimed in claim 1, wherein material from which dual-function interface layer is made is selected from ceramic materials, combinations of EVA and a ceramic material and silicon pastes.

4. The hybrid solar receiver as claimed in claim 3, wherein the ceramic material is chosen from aluminium nitride (AlN), beryllium oxide (BeO) and alumina ($Al_2O_3$).

5. The hybrid solar receiver as claimed in claim 1, wherein material from which the encapsulation layer is made is selected from a group comprising EVA, PVB, EVA doped with metal particles and PVB doped with metal particles.

6. The hybrid solar receiver as claimed in claim 1, wherein the dissipation area has fins on its surface in order to increase the heat exchange surface and the dissipation area is connected to an extraction heat exchanger that is fed with a heat transfer fluid.

7. The hybrid solar receiver as claimed in claim 1, wherein a surface of the heat pipe, except a portion of the surface that is in contact with the rear face of the array of photovoltaic cells, and a surface of dissipation area, is covered with a material having a radiation absorption coefficient that is greater than its radiation emission coefficient.

8. The hybrid solar receiver as claimed in claim 1, wherein an outer surface of the evaporation area is semi-circular with a planar surface, and the rear face of the array of photovoltaic cells faces the planar surface to which it is linked via the dual-function interface layer.

9. The hybrid solar receiver as claimed in claim 1, wherein an outer surface of the evaporation area of the heat pipe is rectangular, and at least one of four planar surfaces of the evaporation area and the rear face of the array of photovoltaic cells is in contact via the dual-function interface layer.

10. The hybrid solar receiver as claimed in claim 1, wherein an outer surface of the evaporation area is cylindrical, and the rear face of the array of photovoltaic cells is in contact with the outer surface of the cylindrical evaporation area via the dual-function interface layer.

11. The hybrid solar receiver as claimed in claim 1, wherein the heat pipe has a fin on each side of the evaporation area.

12. The hybrid solar receiver as claimed in claim 1, wherein the transparent plate has an anti-reflective surface treatment.

13. The hybrid solar receiver as claimed in claim 1, wherein the array of photovoltaic cells covers an entire surface of the evaporation area.

14. The hybrid solar receiver as claimed in claim 1, wherein the evaporation area of the heat pipe is enclosed in a vacuum tube in order to reduce thermal losses.

15. A solar system comprising a linear-concentrating solar concentrator and a hybrid solar receiver as claimed in claim 1, wherein electricity for powering a drive motor in order to track the position of the sun and to pump heat transfer fluid is provided by the system itself.

16. The hybrid solar receiver as claimed in claim 1, wherein the rear face of the array of photovoltaic cells comprises a planar surface that aligns with a corresponding planar surface of the heat discharge area of the heat pipe.

17. The hybrid solar receiver as claimed in claim 1, wherein the dual-function interface layer comprises a ceramic material in contact with the rear face of the array of photovoltaic cells and in contact with the heat discharge area of said heat pipe.

18. A hybrid solar receiver designed for concentrating solar systems for simultaneously generating electricity and heat, comprising:
an array of photovoltaic cells for converting light concentrated on the array of photovoltaic cells into electricity, the array of photovoltaic cells having a front face, for receiving the light, and a rear face located opposite the front face, the rear face comprising a planar surface;
a heat pipe having an evaporation area including a channel for accommodating flow of a liquid coolant and for discharging heat accumulated at the array of photovoltaic cells via the liquid coolant, the evaporation area having a planar surface that is aligned with the planar surface of the rear face of the array of photovoltaic cells, the heat pipe having a dissipation area for dissipating heat absorbed by the array of photovoltaic cells;
a dual-function interface layer in contact with the rear face of the array of photovoltaic cells and in contact with the evaporation area of said heat pipe, the dual-function interface layer providing electrical insulation between the array of photovoltaic cells and the heat pipe, and transfer of heat accumulated by the array of photovoltaic cells to the liquid coolant of the heat pipe;
an encapsulation layer coating a surface of the array of photovoltaic cells; and
a transparent plate located on the encapsulation layer.

19. The hybrid solar receiver as claimed in claim 1, wherein the array of photovoltaic cells for converting light concentrated on the array of photovoltaic cells into electricity includes silicon.

* * * * *